(12) United States Patent
Kang

(10) Patent No.: US 9,373,411 B2
(45) Date of Patent: Jun. 21, 2016

(54) ANTIFUSE CONTROL CIRCUIT AND ANTIFUSE READING METHOD

(71) Applicant: Kyu-Chang Kang, Hwaseong-Si (KR)

(72) Inventor: Kyu-Chang Kang, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/512,024

(22) Filed: Oct. 10, 2014

(65) Prior Publication Data

US 2015/0235712 A1  Aug. 20, 2015

(30) Foreign Application Priority Data

Feb. 17, 2014 (KR) .......................... 10-2014-0017884

(51) Int. Cl.
*G11C 17/16* (2006.01)
*G11C 17/18* (2006.01)
*G11C 7/08* (2006.01)
*G11C 7/20* (2006.01)

(52) U.S. Cl.
CPC ........ *G11C 17/18* (2013.01); *G11C 7/08* (2013.01); *G11C 7/20* (2013.01); *G11C 17/16* (2013.01)

(58) Field of Classification Search
CPC .................................. G11C 17/16; G11C 5/14
USPC ..................................................... 365/96, 226
See application file for complete search history.

(56) References Cited

U.S. PATENT DOCUMENTS

| 6,064,617 A | * | 5/2000 | Ingalls | G11C 29/785 365/200 |
| 6,178,501 B1 | * | 1/2001 | Ingalls | G11C 7/1045 711/166 |
| 6,246,623 B1 | * | 6/2001 | Ingalls | G11C 29/785 327/525 |
| 6,477,094 B2 | | 11/2002 | Kim et al. | |
| 6,741,117 B2 | * | 5/2004 | Lee | G11C 17/18 327/525 |
| 8,116,152 B2 | | 2/2012 | Kaku et al. | |
| 8,258,856 B2 | | 9/2012 | Lee et al. | |
| 2001/0037478 A1 | * | 11/2001 | Kim | G11C 17/18 714/710 |
| 2003/0147287 A1 | | 8/2003 | Lee | |
| 2006/0097345 A1 | * | 5/2006 | Marr | G11C 17/16 257/530 |
| 2009/0059645 A1 | * | 3/2009 | Schmitt | G11C 17/18 365/96 |
| 2013/0223171 A1 | * | 8/2013 | Kim | G11C 29/04 365/200 |

FOREIGN PATENT DOCUMENTS

| JP | 2010-123255 A | 6/2010 |
| KR | 10-0420125 B1 | 2/2004 |
| KR | 10-0687848 B1 | 2/2007 |

* cited by examiner

*Primary Examiner* — Michael Tran
(74) *Attorney, Agent, or Firm* — Volentine & Whitt, PLLC

(57) ABSTRACT

A method of reading an antifuse in a semiconductor memory device during a power-up routine includes; generating a read voltage used during an antifuse read operation performed during the power-up routine to read data stored in an antifuse cell array of the antifuse, and beginning execution of the antifuse read operation only after an activation delay has elapsed following a sensing of the level of the read voltage.

18 Claims, 5 Drawing Sheets

ANTIFUSE CONTROL CIRCUIT AND ANTIFUSE READING METHOD

CROSS-REFERENCE TO RELATED APPLICATIONS

This U.S. non-provisional patent application claims priority under 35 U.S.C. §119 to Korean Patent Application No. 10-2014-0017884 filed on Feb. 17, 2014, the subject matter of which is hereby incorporated by reference.

BACKGROUND

The present inventive concept relates to antifuse control circuits and methods of executing antifuse read operations. More particularly, the inventive concept relates to antifuse control circuits controlling the start time of an antifuse read operation performed during a power-up routine for a semiconductor memory device.

During the power-up of semiconductor memory devices it is important to quickly and efficiently read control data that is stored in an antifuse. However, certain control voltages necessary to the execution of the antifuse read operation must be stable in order to obtain correct data.

SUMMARY

Embodiments of the inventive concept provide an antifuse control circuit configured to control an antifuse read operation performed during a power-up routine for a semiconductor memory device. The antifuse control circuit comprises; a high voltage generator that provides a read voltage used during the antifuse read operation to read-out data stored in an antifuse, and a sensing controller that generates a read enable signal controlling the start of the antifuse read operation, wherein the sensing controller activates the read enable signal after an activation delay having a duration determined by the sensed level of the read voltage once the read voltage reaches a reference read voltage.

Embodiments of the inventive concept provide a method of executing an antifuse read operation performed during a power-up routine for a semiconductor memory device. The method comprises; upon detecting a power-up state for the semiconductor memory device, generating a read voltage used during the antifuse read operation to read-out data stored in an antifuse, once the read voltage reaches a reference read voltage, setting an activation delay according to the level of the read voltage, and activating a read enable signal that starts execution of the antifuse read operation after the activation delay has elapsed.

Embodiments of the inventive concept provide a method of reading an antifuse in a semiconductor memory device during a power-up routine. The method comprises; generating a read voltage used during an antifuse read operation performed during the power-up routine to read data stored in an antifuse cell array of the antifuse, and beginning execution of the antifuse read operation only after an activation delay has elapsed following a sensing of the level of the read voltage.

BRIEF DESCRIPTION OF THE DRAWINGS

Certain embodiments of the inventive concept will be described with reference to the accompanying drawings.

DETAILED DESCRIPTION

Embodiments of inventive concept will be described more fully hereinafter with reference to the accompanying drawings. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

Figure 1:
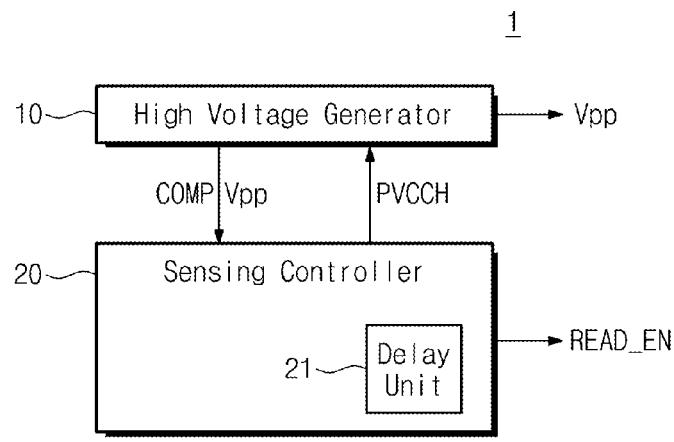
FIG. 1 is a block diagram illustrating an antifuse control circuit in accordance with embodiments of the inventive concept.

Figure (FIG.) 1 is a block diagram illustrating an antifuse control circuit 1 in accordance with certain embodiments of the inventive concept. The antifuse control circuit 1 may be used to control the execution of read operations with respect to an antifuse circuit in various types of semiconductor memory devices. Referring to FIG. 1, the antifuse control circuit 1 generally comprises a high voltage generator 10 and a sensing controller 20.

In its operation, the antifuse control circuit 1 may be used to activate a read enable signal (READ_EN) that initiates (or "starts") an antifuse read operation. The antifuse control circuit 1 may activate the read enable signal following an established "activation delay" in response to the level of a read voltage (Vpp). That is, once the antifuse control circuit 1 determines that the read voltage has reached a predetermined "read threshold voltage" and following expiration of the activation delay, the read enable signal will be activated. By use of the activation delay, the antifuse control circuit 1 is able to obtain sufficient timing margin of until the read voltage reaches a stable voltage level after it reaches the read threshold voltage.

In the illustrated embodiment of FIG. 1, the high voltage generator 10 is used to generate the read voltage (Vpp), where the read voltage is variously used as an operating voltage to read an antifuse. For example, the read voltage may be used as a word line voltage connected to an antifuse. The sensing controller 20 is used to activate the read enable signal (READ_EN), where the read enable signal is a control signal indicating the start of a read operation directed to an antifuse. In the illustrated embodiment of FIG. 1, the sensing controller 20 includes a delay unit 21 configured to provide the activation delay with respect to the read enable signal. To reduce the possibility of a "read fail" outcome as the result of an antifuse read operation, the level of the read voltage should be stabilized before the read enable signal is activated.

Assuming a case where an antifuse is included in a mobile Dynamic Random Access Memory (DRAM) lacking a reset pin, this type of antifuse read operation may be performed before a "normal command" (e.g., a command not associated with the power-up routine such as a data read/write operation) is received once the appropriate circuitry reaches a power-up state. As will be seen hereafter, certain timing margin consideration must be observed with respect to execution of the antifuse operation and a first-received, normal command once a power-up state has been achieved. The description that follows assumes an antifuse control circuit configured to control an antifuse included in a mobile DRAM. However, those skilled in the art will understand that this is only an illustration and that the scope of the inventive concept is not limited to only mobile DRAMs.

Once the level of an externally applied voltage (e.g., VDD) reaches a reference power supply voltage level, the sensing controller 20 provides a power-up sensing signal (PVCCH) to the high voltage generator 10. In response to the power-up sensing signal, the high voltage generator 10 begins generating (i.e., increases the level of) the read voltage. For example, the high voltage generator 10 may cause the level of the read voltage (Vpp) to increase by pumping electrical charge in response to the power-up sensing signal (PVCCH). Once the level of the read voltage increases to the point where it reaches the reference read voltage level, the high voltage generator 10 activates a comparison signal (COMP) that is provided to (e.g., returned as a feedback signal to) the sensing controller 20.

In this regard, the sensing controller 20 may be used to sense the level of the read voltage after the activation delay expires beginning from when the comparison signal is activated. Here, the delay unit 21 of the sensing controller 20 may be used to set (i.e., define) an activation delay on the basis of the sensed level of the read voltage. In general, the lower the sensed level for the read voltage, the longer the activation delay will be. And following expiration of the defined activation delay, the delay unit 21 will activate the read enable signal.

In this manner, after determining whether the read voltage has reached a predetermined voltage, the antifuse control circuit 1 may activate the read enable signal after the defined activation time has elapsed. And using the activation time for the read enable signal, the antifuse control circuit 1 may obtain sufficient a timing margin such that the read voltage reaches a stable voltage level after it reaches the reference power supply voltage level.

Figure 2:
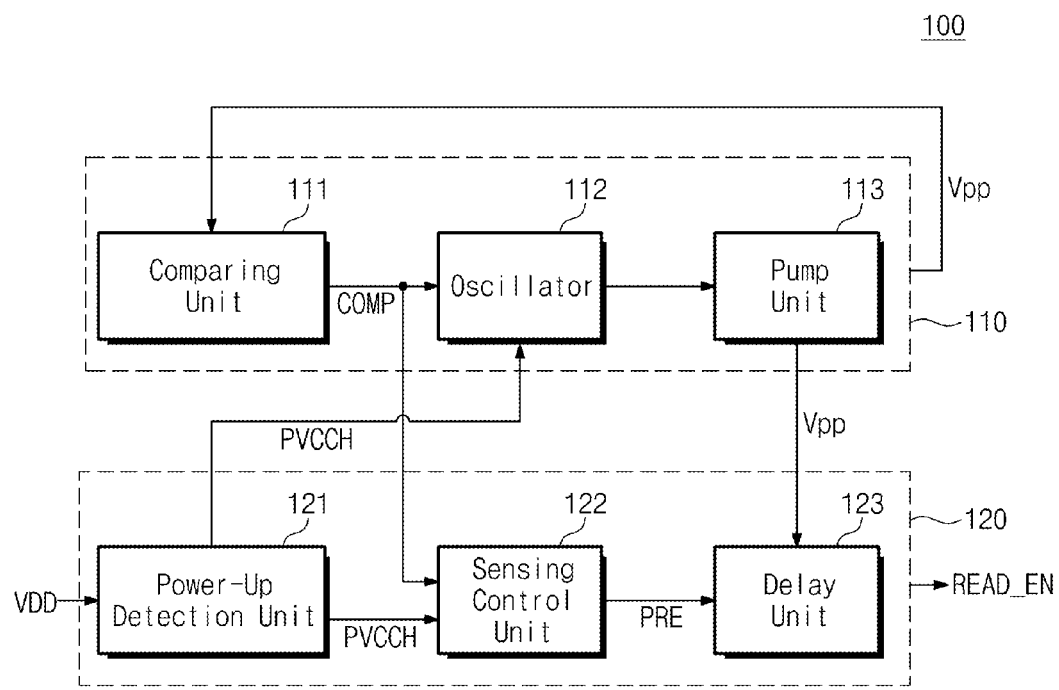
FIG. 2 is a block diagram further illustrating the antifuse control circuit of FIG. 1.

FIG. 2 is a block diagram further illustrating in one example (100) the antifuse control circuit of FIG. 1. Referring to FIG. 2, the antifuse control circuit 100 comprises a high voltage generator 110 and a sensing controller 120.

As described above, upon determining that the read voltage (Vpp) has reached (e.g.,) a reference read voltage level, the antifuse control circuit 100 activates the read enable signal (READ_EN) following an activation delay that has been set according to a sensed level of the read voltage. Using the activation delay, the antifuse control circuit 100 is able to obtain sufficient timing margin such that the read voltage reaches a stable voltage level after reaching the reference power supply level.

In the illustrated example of FIG. 2, the high voltage generator 110 comprises a comparing unit 111, an oscillator 112 and a pump unit 113. The high voltage generator 110 may be used to generate and maintain the read voltage (Vpp) at a specific level using a voltage control feedback loop.

That is, the comparing unit 111 is provided with the read voltage from the pump unit 113, and determines whether the read voltage has reached a predetermined "reference read voltage". The comparing unit 111 provides the comparison signal (COMP) by determining whether that the read voltage has reached the reference read voltage. For example, an activated comparison signal may be generated by the comparing unit 111 when the read voltage is less than the reference read voltage. The comparing unit 111 provides the comparison signal to the oscillator 112 and the sensing controller 120.

The oscillator 112 generates a pulse signal in response to the activated comparison signal provided by the comparing unit 111 and further in response to the power-up sensing signal (PVCCH) provided by the sensing controller 120. For example, the oscillator 112 may generate the pulse signal when both the comparison signal and the power-up sensing signal are activated.

The pump unit 113 pumps charge in response to the pulse signal provided by the oscillator 112. The level of the read voltage being generated by the pump unit 113 increases in response to each pumping operation performed by the pump unit 113, and the pumping operation of the pump unit 113 continues until the level of the read voltage reaches the reference read voltage.

The sensing controller 120 includes a power-up detection unit 121, a sensing control unit 122 and a delay unit 123, such that the sensing controller 120 is configured to activate the read enable signal (READ_EN) after a defined activation delay has elapsed.

The power-up detection unit 121 activates the power-up sensing signal (PVCCH) when the externally-provided voltage VDD reaches the reference power supply voltage level, and provides the power-up sensing signal to the oscillator 112 and sensing control unit 122.

The sensing control unit 122 receives the comparison signal (COMP) from the comparing unit 111, and the power-up sensing signal (PVCCH) from the power-up sensing unit 121, and activates a preceding signal (PRE) in response to the comparison signal and power-up sensing signal. For example, the sensing control unit 122 may activate the preceding signal (PRE) when the comparison signal and power-up sensing signal are both activated. The preceding signal is provided to the delay unit 123.

If the preceding signal PRE is activated, the delay unit 123 senses a level of the read voltage (Vpp) as provided by the pump unit 113, following a sensing delay following activation of a designated control signal. For example, the delay unit 123 may sense the level of the read voltage (Vpp) after a predetermined sensing delay (e.g., 20 us) following activation of the power-up sensing signal (PVCCH).

Then, the delay unit 123 may define (or "set") the activation delay on the basis of the sensed level of the read voltage. For example, the lower the level of the read voltage, the longer activation delay set by the delay unit 123. In this manner, the delay unit 123 may set an activation delay that ensures completion of the antifuse read operation before a normal command is received. In this regard, a "command time period" may be establish that is the minimum time upon power-up that a normal command may be input to the semiconductor memory device including the antifuse.

Figure 3:
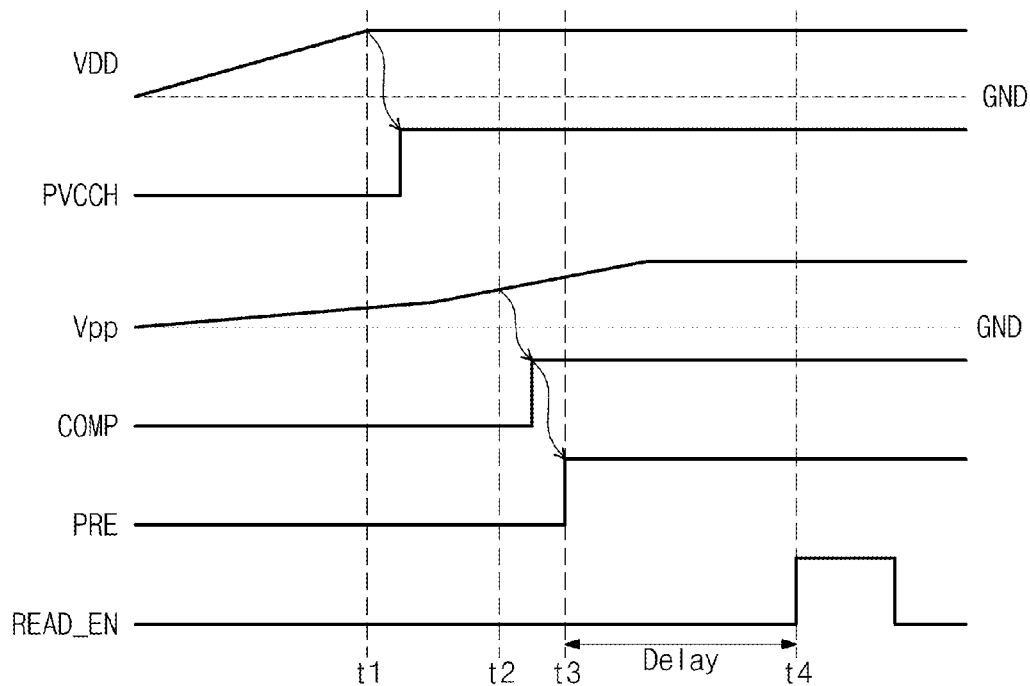
FIG. 3 is a timing diagram illustrating control signals and power supply voltages during the execution of an antifuse read operation using the antifuse control circuit of FIG. 2.

FIG. 3 is a timing diagram for various control signals and power supply voltages used during the operation of the antifuse control circuit 100 of FIG. 2. Referring to FIGS. 2 and 3, using a defined activation delay, the antifuse control circuit 100 is able to obtain sufficient timing margin such that the read voltage (Vpp) reaches a stable voltage level after reaching a predetermined reference read voltage.

The externally-provided voltage VDD increases in level over time until it reaches the reference power supply voltage level at time t1. Once the externally-provided voltage VDD reaches the reference power supply voltage level, the power-up sensing signal (PVCCH) is activated by the power-up sensing unit 121.

In response to the activated power-up sensing signal, the level of the read voltage (Vpp) is increased by operation of the oscillator 112 and pump unit 113. As it increases, the level of the read voltage ultimately reaches the reference read voltage at time t2. Once the level of the read voltage reaches the reference read voltage, the comparison signal (COMP) is activated by the comparing unit 111.

In response to the activated power-up sensing signal and comparison signal, the preceding signal PRE is activated at time t3. At this time, in response to a level of the read voltage, the delay unit 123 sets the activation delay (e.g., from time t3 to time t4), wherein the lower the level of the read voltage, the longer the activation delay.

Following the activation delay, the read enable signal (READ_EN) is activated by the delay unit 123 at time t4.

Thus, the antifuse control circuit 100 of FIG. 2 is able to determine whether or not the read voltage (Vpp) has reached a predetermined reference read voltage using the comparison signal COMP. In addition, the antifuse control circuit 100 is able to control the timing of the antifuse read operation in relation to a stable voltage condition for the read voltage. As a result, the read voltage (Vpp) will not be so low or vary in such a manner that the antifuse read operation fails.

Figure 4:
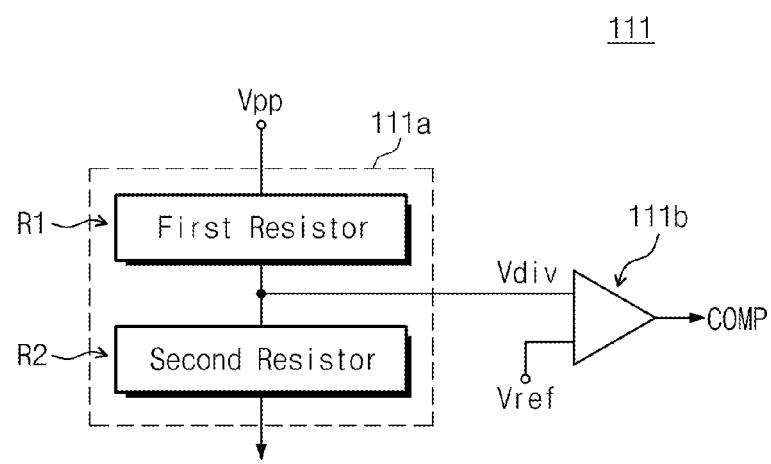
FIG. 4 is a block diagram further illustrating in one example the comparing unit of FIG. 2.

FIG. 4 is a block diagram further illustrating in one example the comparing unit 111 of FIG. 2. Referring to FIGS. 2 and 4, the comparing unit 111 comprises a resistor unit 111a and a comparator 111b. The resistor unit 111a includes a first resistor R1 and a second resistor R2.

The first and second resistors R1 and R2 divide the read voltage (Vpp), as provided from the pump unit 113, in order to generate a division voltage (Vdiv). The level of the division voltage will be determined by the a ratio of the resistances of the first and second resistors R1 and R2.

The comparator 111b compares the level of the division voltage with the level of a reference voltage (Vref), and activates the comparison signal (COMP) in accordance with the comparison result. For example, the comparator 111b may activate the comparison signal if the level of the division voltage is greater than the level of the reference voltage. That is, using the division voltage, the comparing unit 111 constitutes a sensing circuit sensing that accurately determines the level of the read voltage in relation to the reference read voltage.

Figure 5:
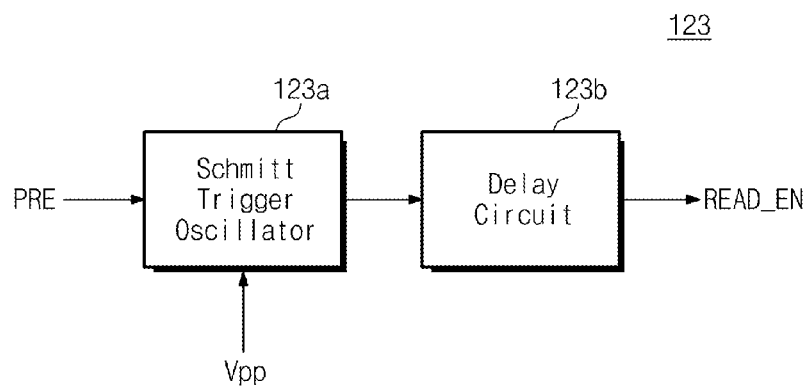
FIG. 5 is a block diagram further illustrating in one example the delay unit of FIG. 2.

FIG. 5 is a block diagram further illustrating in one example the delay unit 123 of FIG. 2. Referring to FIGS. 2 and 5, the delay unit 123 comprises a Schmitt trigger oscillator 123a and a delay circuit 123b.

With this configuration, the delay unit 123 is able to activate the read enable signal (READ_EN) in response to the preceding signal (PRE) provided by the sensing control unit 122 and the read voltage (Vpp) provided by the pump unit 113.

The Schmitt trigger oscillator 123a generates a pulse signal in response to activation of the preceding signal PRE. The threshold point of the Schmitt trigger included in the Schmitt trigger oscillator 123a may be controlled by the level of the read voltage.

Thus, the frequency and duty rate of the pulse signal being generated by the Schmitt trigger oscillator 123a will vary in response to the threshold point of the Schmitt trigger as controlled by the level of the read voltage. Hence, the lower the level of the read voltage, the lower the frequency of the pulse signal, and the longer the duration (or period) of the corresponding pulse signal. In this manner, the activation delay may be set according to the frequency of the pulse signal provided by the Schmitt trigger oscillator 123a. The delay circuit 123b activates the read enable signal (READ_EN) after expiration of the activation delay in response to the pulse signal input from the Schmitt trigger oscillator 123a. Thus, using the Schmitt trigger oscillator 123a, the delay unit 123 may effectively set an activation delay in response to the level of the read voltage (Vpp), activate the read enable signal (READ_EN) only after activation delay has elapsed to thereby cause execution of an antifuse read operation in a stable read voltage environment.

Figure 6:
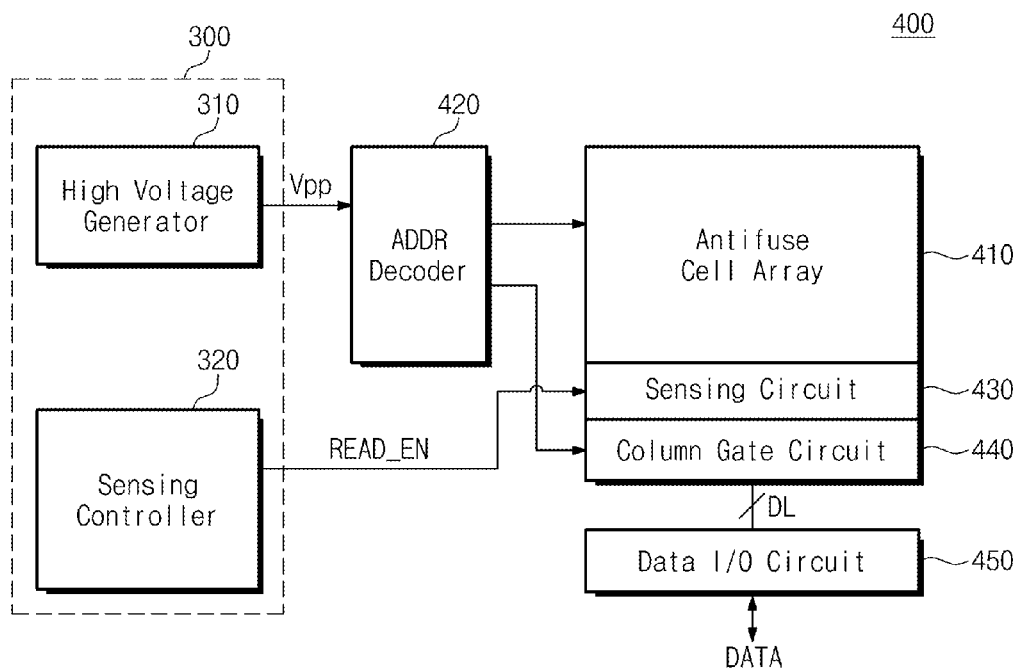
FIG. 6 is a block diagram illustrating an antifuse devise incorporating the antifuse control circuit of FIG. 1.

FIG. 6 is a block diagram illustrating application of an antifuse control circuit 300 consistent with certain embodiments of the inventive concept within an exemplary antifuse device 400. Referring to FIG. 6, the antifuse device 400 includes an antifuse cell array 410, an address decoder 420, a sensing circuit 430, a column gate circuit 440, and a data input/output (I/O) circuit 450, as well as the antifuse control circuit 300.

Collectively, the address decoder 420, sensing circuit 430 and column gate circuit 440 constitute a "readout circuit". The antifuse device 400 is able to read data stored in the antifuse cell array 410 using the readout circuit.

Consistent with the foregoing description, the antifuse control circuit 300 comprises a high voltage generator 310 and a sensing controller 320. The high voltage generator 310 and sensing controller 320 of FIG. 6 may have the same constitution and operate similarly with respect to the high voltage generator 10 and sensing controller 20 of FIG. 1, for example.

The antifuse cell array 410 includes a plurality of antifuse cells respectively connected among a plurality of word lines and a plurality of bit lines. Each antifuse cell may be embodied by a NOR type flash memory cell that is capable of being electrically programmed and erased. In this regard, a mask ROM cell may be programmed through an ion implantation process during manufacture, or alternately, an electrically programmable Ferro-dielectric memory cell may be used. However, these are just illustrations of many possible implementations that may be used in various embodiments of the inventive concept.

The sensing circuit 430 may be used to sense data stored in an antifuse cell arranged in an area selected by the address decoder 420. Data sensed in the sensing circuit 430 may be communicated transmitted to the data I/O circuit 450 via the column gate circuit 440.

The antifuse control circuit 300 may be used to generate the read voltage (Vpp) as a control signal used to read-out data stored in the antifuse cell array 410, as well as the read enable signal (READ-EN) controlling the timing of the antifuse read operation with respect to the antifuse cell array 410. Here, the antifuse control circuit 300 provides the read voltage (Vpp) to the address decoder 420 and the read enable signal (READ_EN) provided to the sensing circuit 430 controls the timing of the antifuse read operation execution as performed by the address decoder 420.

As described with reference to FIGS. 1, 2 and 3, the antifuse control circuit 300 is able to determine whether the read voltage has reached a reference read voltage, and thereafter activate the read enable signal after an activation delay time defined according to the level of the read voltage. Using the activation time, the antifuse control device 400 including the antifuse control circuit 300 is able to obtain sufficient timing margin such that the read voltage reaches a stable level after it has reached the predetermined reference read voltage.

Figure 7:
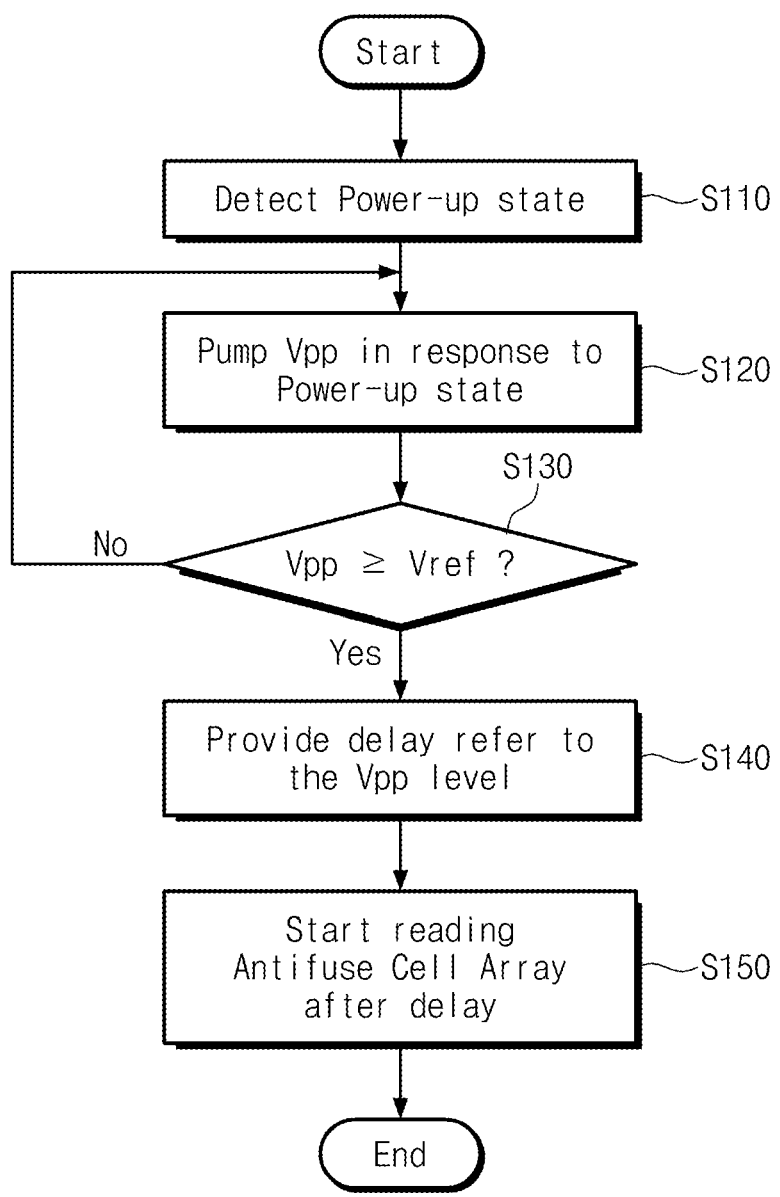
FIG. 7 is a flow chart summarizing a method of executing an antifuse read operation in accordance with embodiments of the inventive concept.

FIG. 7 is a flow chart summarizing a method of executing an antifuse read operation in accordance with certain embodiments of the inventive concept.

First, the level of an externally-provided voltage (e.g., VDD) is monitored to detect the beginning of a power-up routine that results in a power-up state (S110). Here, the power-up state may be defined as a point in time when the externally-provided voltage reaches a predetermined reference power supply voltage level. The power-up state may be sensed by the power-up sensing unit 121 of FIG. 2, for example.

Once the power-up state is detected, electrical charge is pumped to increases the level of a read voltage (S120). The read voltage (Vpp) may be pumped by the high voltage generator 110 of FIG. 2, for example.

The level of the read voltage (Vpp) is compared with the reference read voltage (Vref) (S130). Once the level of the read voltage is at least equal to the reference read voltage (S130=Yes), the level of the read voltage is sensed to determine the duration of an activation delay and the activation delay is applied (S140).

Following the activation delay, the read enable signal (READ_EN) is provided to start the antifuse read operation with respect to the antifuse cell array 410 (S150).

According to methods of executing an antifuse read method according to embodiments of the inventive concept, after it is determined that the read voltage reaches a predetermined reference read voltage, a read enable signal may be activated following an activation delay. The activation delay may be set in response to the sensed level of the read voltage. In this manner, an appropriate timing margin may be established such that the read voltage reaches a stable level after it has reached the reference read voltage threshold.

Figure 8:
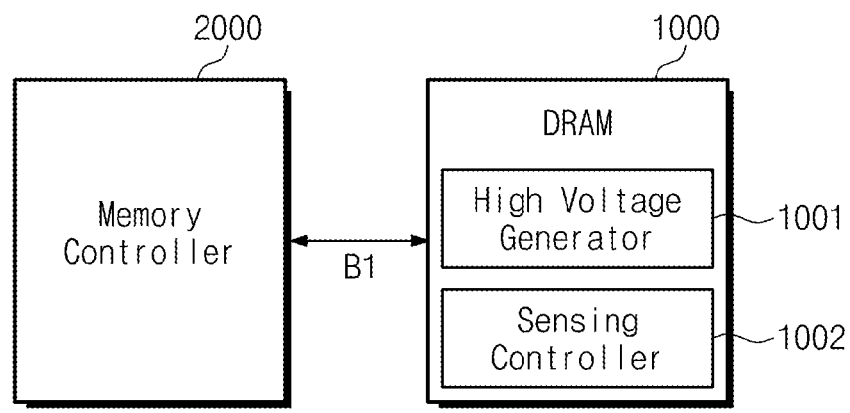
FIG. 8 is a block diagram of a memory system including the antifuse control circuit of FIG. 1.

FIG. 8 is a block diagram of a memory system including an antifuse control circuit according to an embodiment of the inventive concept.

Referring to FIG. 8, the memory system may include a memory controller 2000 and a dynamic random access memory (DRAM) 1000. The DRAM 1000 is connected to the memory controller 2000 through a system bus B1 to receive data, an address and a command. The DRAM 1000 can provide data read from a memory cell to the memory controller 2000 through the system bus B1.

The memory controller 2000 can be connected to a host (not shown) through a given interface.

The DRAM 1000 can adopt a high voltage generator 1001 and a sensing controller 1002 having the same constitution as those of FIG. 1. In the memory system, after determining whether a read voltage has reached a reference read voltage during a power-up operation, the DRAM 1000 can activate a read enable signal following an activation delay defined in accordance with the level of the read voltage. Using the variably defined activation delay, the DRAM 1000 may obtain timing margins sufficient for the read voltage Vpp to reach a stable voltage level after it reaches the reference read voltage. Thus, voltage stability during the power-up read operation of a memory system including the DRAM 1000 can be improved.

Figure 9:
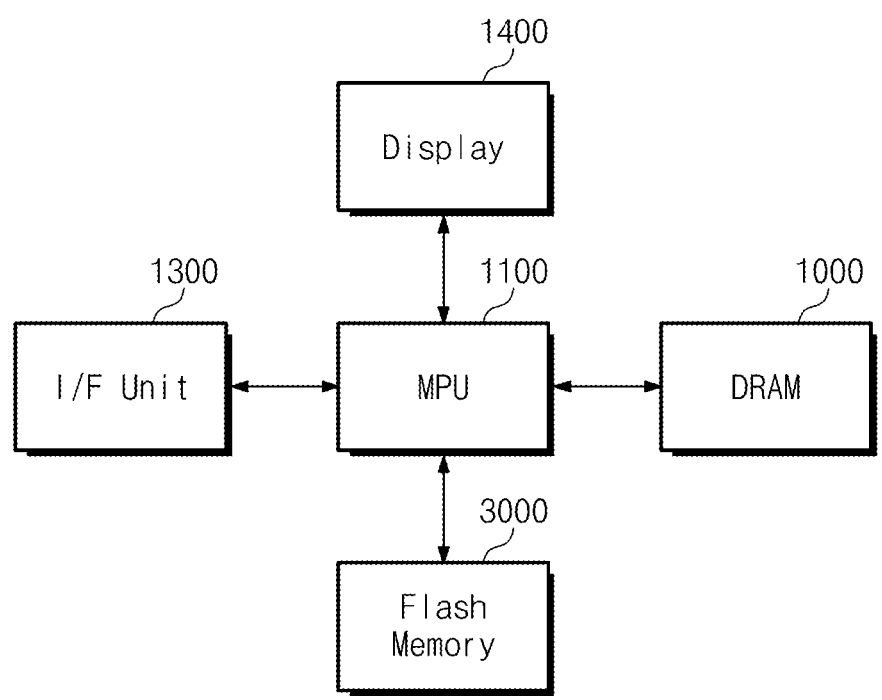
FIG. 9 is a block diagram illustrating a mobile device application in accordance with some embodiments of the inventive concept.

FIG. 9 is a block diagram illustrating a mobile device application in accordance with some embodiments of the inventive concept.

Referring to FIG. 9, a mobile device, for example, a notebook or a portable electronic device may include a micro processing unit (MPU) 1100, a display 1400, an interface unit 1300, a DRAM 1000, and a flash memory 3000.

The MPU 1100, the DRAM 1400 and the flash memory 3000 can be manufactured or packaged in one chip. For example, the DRAM 1000 and the flash memory 3000 can be embedded into the mobile device.

In the case that the mobile device is a portable communication device, a modem and a transceiver performing functions of transmission/reception of communication data and modulation/demodulation of data can be connected to the interface unit 1300.

The MPU 1100 controls an overall operation of the mobile device according to a program previously set.

The DRAM 1000 is connected to the MPU 1100 and can function as a buffer memory or main memory of the MPUT 1100. The DRAM 1000 may include the high voltage generator 1001 and sensing controller 1002 described in relation to FIG. 8.

The flash memory 3000 may be a NOR or NAND type flash memory.

The display 1400 is a liquid crystal having a backlight, a liquid having a LED light source or an OLED and may have a touch screen. The display 1400 functions as an output device displaying an image such as character, number, picture, etc. as a color.

The mobile device may function as a smart card by adding or subtracting a constituent element if necessary.

The mobile device can connect a separate interface to an external communication device. The communication device may be a digital versatile disc (DVD) player, a computer, a set top box (STB), a game machine, a digital camcorder, etc.

Although not illustrated in the drawing, the mobile device may further include an application chipset, a camera image processor (CIS), a mobile DRAM, etc.

Chips constituting the mobile device can be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

A flash memory is included in the illustrated embodiment of FIG. 9 but various types of nonvolatile storages may be used.

The nonvolatile storage can store data information having various forms of data such as a text, a graphic, a software core, etc.

The nonvolatile storage can be embodied by, for example, an electrically erasable programmable read-only memory (EEPROM), a flash memory, a magnetic random access memory (MRAM), a spin-transfer torque MRAM, a conductive bridging RAM (CBRAM), a ferroelectric RAM (Fe-RAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

The antifuse control circuit and the method of controlling an antifuse read operation according to embodiments of the inventive concept provide a more stable control voltage environment during a power-up routine.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An antifuse control circuit configured to control an antifuse read operation performed during a power-up routine for a semiconductor memory device, the antifuse control circuit comprising:
a high voltage generator configured to provide a read voltage used during the antifuse read operation to read-out data stored in an antifuse, and to compare the read voltage to a reference read voltage; and
a sensing controller configured to generate a read enable signal controlling the start of the antifuse read operation, and to activate the read enable signal after an activation delay, having a duration determined by a level of the read voltage when the read voltage reaches the reference read voltage, is elapsed.

2. The antifuse control circuit of claim 1, wherein the lower the sensed level of the read voltage, the longer the activation delay.

3. The antifuse control circuit of claim 1, wherein the high voltage generator comprises:
a comparing unit configured to activate a comparison signal when the read voltage reaches the reference read voltage;
an oscillator configured to generate a pulse signal in response to the comparison signal and a power-up sensing signal; and
a pump unit configured to pump electrical charge to increase the read voltage in response to the pulse signal.

4. The antifuse control circuit of claim 3, wherein the sensing controller comprises:
a power-up detection unit configured to activate the power-up sensing signal when an externally-provided voltage reaches a reference power supply voltage level;
a sensing control unit configured to activate a preceding signal in response to the power-up sensing signal and comparison signal; and
a delay unit configured to set the activation delay in response to the preceding signal and the read voltage.

5. The antifuse control circuit of claim 4, wherein the comparing unit activates the comparison signal when the read voltage reaches the reference read voltage, the sensing controller activates the power-up sensing signal when the external voltage reaches the reference power supply voltage and the oscillator generates the pulse signal when the comparison signal is inactivated and the power-up sensing signal is activated.

6. The antifuse control circuit of claim 5, wherein the comparing unit comprises:
a resistor unit configured to divide the read voltage and generate a division voltage; and
a comparator configured to activate the comparison signal by comparing the division voltage with a reference voltage.

7. The antifuse control circuit of claim 4, wherein the delay unit comprises:
a Schmitt trigger oscillator configured to generate a pulse signal in response to the preceding signal; and
a delay circuit configured to set the activation delay in response to the pulse signal and activates the read enable signal on the basis of the activation delay,
wherein the frequency of the pulse signal varies in response to the level of the read voltage.

8. The antifuse control circuit of claim 7, wherein the lower the level of the read voltage, the lower the frequency of the pulse signal.

9. The antifuse control circuit of claim 1, wherein the semiconductor memory device is a mobile DRAM.

10. A method of executing an antifuse read operation performed during a power-up routine for a semiconductor memory device, the method comprising:
upon detecting a power-up state for the semiconductor memory device, generating a read voltage used during the antifuse read operation to read-out data stored in an antifuse;
comparing, with a comparator, the read voltage to a reference read voltage;
once the read voltage reaches the reference read voltage, setting an activation delay according to the level of the read voltage; and
activating a read enable signal that starts execution of the antifuse read operation after the activation delay has elapsed.

11. The method of claim 10, wherein the power-up state for the semiconductor memory device is detected when an externally-provided power supply voltage reaches a reference power supply voltage level.

12. The method of claim 11, wherein the lower the level of the read voltage, the longer the activation delay.

13. A method of reading an antifuse in a semiconductor memory device during a power-up routine, the method comprising:
generating a read voltage used during an antifuse read operation performed during the power-up routine to read data stored in an antifuse cell array of the antifuse; and
beginning execution of the antifuse read operation after an activation delay has elapsed following a sensing of the level of the read voltage, wherein:
the sensing of the level of the read voltage occurs once the level of the read voltage reaches a reference read voltage, and
the duration of the activation delay varies with the sensed level of the read voltage once the level of the read voltage reaches the reference read voltage.

14. The method of claim 13, wherein the generating of the read voltage during the power-up routine comprises:
activating a power-up sensing signal when an externally-provided power supply voltage reaches a reference power supply voltage level;
activating a comparison signal when the level of the read voltage reaches the reference read voltage; and
activating a preceding signal in response to the activated power-up sensing signal and activated comparison signal,
wherein the activation delay begins upon activation of the preceding signal and ends upon activation of a read enable signal that starts the antifuse read operation.

15. The method of claim 14, further comprising:
generating a pulse signal using an oscillator in response to the activation of the power-up sensing signal; and
pumping electrical charge to increase the level of the read voltage in response to the pulse signal.

16. The method of claim 14, wherein activating the comparison signal comprises:
dividing the read voltage using a voltage divider to generate a division voltage; and
comparing the division voltage to the reference read voltage.

17. The method of claim 14, wherein the semiconductor memory device comprises an address decoder that receives the read voltage and accesses the antifuse cell array during the antifuse read operation in response to the read voltage.

18. The method of claim 17, wherein the semiconductor memory device further comprises a sensing circuit that receives the read enable signal.

* * * * *